United States Patent
Okhotnikov et al.

(10) Patent No.: US 7,313,291 B2
(45) Date of Patent: Dec. 25, 2007

(54) OPTICAL MODULATOR

(75) Inventors: Oleg Okhotnikov, Tampere (FI); Mircea Guina, Tampere (FI)

(73) Assignees: Nokia Corporation, Espoo (FI); Modulight Oy, Tampere (FI)

( * ) Notice: Subject to any disclaimer, the term of this patent is extended or adjusted under 35 U.S.C. 154(b) by 99 days.

(21) Appl. No.: 10/974,533

(22) Filed: Oct. 26, 2004

(65) Prior Publication Data
US 2005/0146779 A1 Jul. 7, 2005

Related U.S. Application Data

(63) Continuation of application No. PCT/FI03/00299, filed on Apr. 16, 2003.

(30) Foreign Application Priority Data
Apr. 26, 2002 (FI) .................................. 20020800

(51) Int. Cl.
G02F 1/365 (2006.01)
H01S 5/34 (2006.01)
(52) U.S. Cl. ..................... 385/5; 372/45.012
(58) Field of Classification Search .............. 385/5; 372/45.012
See application file for complete search history.

(56) References Cited

U.S. PATENT DOCUMENTS

| 5,034,783 | A | * | 7/1991 | Chang et al. | ................. | 257/14 |
| 5,345,454 | A | | 9/1994 | Keller | | |
| 5,576,879 | A | | 11/1996 | Nashimoto | | |
| 6,141,359 | A | | 10/2000 | Cunningham et al. | | |
| 6,680,791 | B2 | * | 1/2004 | Demir et al. | ................. | 359/248 |
| 6,697,548 | B2 | * | 2/2004 | LoCascio et al. | ............. | 385/16 |

FOREIGN PATENT DOCUMENTS

EP 0328214 8/1989

* cited by examiner

*Primary Examiner*—Michelle Connelly-Cushwa
*Assistant Examiner*—Jerry T. Rahil
(74) *Attorney, Agent, or Firm*—Ware, Fressola, Van Der Sluys & Adolphson

(57) ABSTRACT

The invention relates to an optically pumped multilayered modulator having surface-normal geometry. The multilayer structure comprises an absorber section through which an optical signal (401) to be modulated is coupled from an input (401) to an output (400). The multilayer structure further comprises control means for supplying a control signal for controlling the transmission characteristics of the absorber section. The control signal is generated by an in-plane waveguide-type laser integrated monolithically with the saturable absorption region. The in-plane control laser includes waveguide regions (405) and multiple-quantum-well layers (409) used as a gain medium. The laser beam is adapted to travel through the absorber section in order to modulate the transmission characteristics of the absorber section.

9 Claims, 3 Drawing Sheets

OPTICAL MODULATOR

CROSS REFERENCE TO RELATED APPLICATION

This application is a continuation of International Application PCT/FI03/00299 filed 16 Apr. 2003 and published in English 6 Nov. 2003 under International Publication Number WO 03/091800.

FIELD OF THE INVENTION

The present invention relates generally to the structure and operation of an optical modulator.

BACKGROUND OF THE INVENTION

There is a growing trend to develop smaller and smaller devices by increasing the number of components fabricated on a single wafer. In the field of high-speed, wide-band optical signal processing and interconnecting technology, a small-sized, low-cost, and efficient modulator is needed. One of the most promising modulators for such applications is a semiconductor surface-normal modulator. It has many advantages, such as low power consumption, small size, polarization insensitivity, simplicity in light coupling, and fiber pigtailing. Surface-normal modulators are especially useful in applications where a high density of output is desired.

Mode-locked lasers are compact sources of ultra-short pulses at high repetition rate. Today there is a great need for mode-locked lasers that provide simultaneously an efficient pulse shaping mechanism producing high-quality pulses with sub-picosecond duration and synchronization to an external clock signal. Several surface-normal devices have been demonstrated to provide control over the pulse repetition rate of the mode-locked pulse train by employing an electrically or optically controlled saturable absorber, i.e. modulators.

In the following, two solutions will be examined by way of examples with the aid of FIGS. 1 and 2. According to FIG. 1, the structure of an antiresonant Fabry-Pérot quantum well modulator is considered. FIG. 2 shows as an example a mode-locked laser system where an optically pumped saturable Bragg mirror is used.

In general a major problem with surface-normal modulators is low modulation contrast and low efficiency. This arises from the fact that the interaction length with an optical beam is limited to a few micrometers. To overcome the problem of the short interaction length, asymmetrical Fabry-Pérot structures have been used in surface-normal modulators. This kind of modulator typically has a pair of asymmetric mirrors separated by an active layer. However, the optical bandwidth of such Fabry-Pérot structures reduces dramatically as the reflectivity of the mirror increases. An electrical field is introduced by placing several multiple-quantum-wells (MQW) in the intrinsic region of a p-i-n diode. The operation of such devices is based on the shift of excitonic absorption resonance in multiple-quantum-wells due to an applied electrical field.

In FIG. 1 the modulator 100 has a multilayer structure comprising a dielectric coating ($TiO_2/SiO_2$) 102, 16-period $\lambda/4$ n-GaAs/AlAs layers 105, a p-doped layer (p-GaAs) 103, intrinsic semiconductor material layers (50-period InGaAs/GaAsP), i.e. multiple-quantum-well (MQW) layers 104, an n-doped semiconductor layer (n+-GaAs) 106, and contact layers (Au) 101 and 107. Should a light signal 108 be applied to the modulator, the DBR (Distributed Bragg Reflector) 105 reflects the light backward. When an electrical field is applied to the modulator, it modulates the absorption of MQWs and thus the light signal. However, the electrical field is unevenly distributed in this structure because the contact 101 through which the electric signal 109 is applied is located asymmetrically, to allow the light 108 to be launched in the modulator (i.e. the light cannot penetrate through the metal contact layer). As is apparent from the above, a drawback of this modulator is low modulation contrast.

FIG. 2 illustrates a mode-locked laser system using an optically pumped saturable Bragg mirror. In this example an optical signal is modulated using a control beam generated by an external laser.

A semiconductor laser 204 generates a light signal which is modulated by a modulator 201. Then the modulated light signal is focused by a lens 202 on a saturable absorber 203. The saturable absorber is a passive device in which the control signal from the semiconductor laser 204 and the mode-locked light of the fiber laser 200 overlap spatially. At the other end the linear cavity has a 99% reflective broad-band dielectric output coupler 205. The multiple-quantum-well region of the saturable absorber is excited optically by the control light from a laser 206 providing the non-linear absorption changes, such as absorption bleaching or saturation. The changes in reflection modulate the losses within the laser cavity and allow the mode-locked pulse train to be synchronized to a clock signal applied to the modulator 201. A drawback of this construction is that it employs a critical alignment of control and signal beams. Another drawback of this setup is that it uses a number of expensive components (e.g. control laser, external modulator, lens) which result in high overall cost.

The objective of the present invention is to overcome the problems described above by providing a modulator that is efficient, small in size, easy to construct, and is economically advantageous to manufacture.

SUMMARY OF THE INVENTION

An optically pumped modulator has a surface-normal geometry comprising a multilayer structure.

Some adjacent layers inside the modulator are adapted to form a semiconductor waveguide laser including a heterojunction with mirror ends. When an electric current is applied through the device, a laser light is generated by the in-plane waveguide structure. In this manner an internal edge-emitting laser diode is formed within the structure.

Further, a certain part of the active region of the edge-emitting in-plane laser diode, i.e. a region comprising multiple-quantum-wells (MQW), is not electrically driven but acts as a saturable absorber. When the internal laser diode emits light, the absorber is saturated (bleached). Correspondingly, when the internal laser diode does not emit light, the absorber is not saturated (not bleached).

Besides the edge-emitting laser diode, a reflecting structure, e.g. distributed Bragg reflector (DBR) is also formed inside the device. The reflecting structure has sufficient reflectivity for the radiation incident normal to the device surface.

When an external optical signal is applied to the modulator through a window opened on the top of the multilayer structure and overlaps with the saturable absorber region, the optical signal travels through the layers, including the waveguide and the absorber, towards the reflecting layer that reflects the optical signal back. Reflection is increased if the absorber is saturated, i.e. when an electric current exceeding the threshold current is applied through the in-plane laser diode. In the absence of sufficient electric current, i.e. below laser threshold, no in-plane laser light is generated within the waveguide, therefore the absorber is not saturated, and the reflection of the external optical signal is low.

BRIEF DESCRIPTION OF THE DRAWINGS

The invention is described more closely with reference to the accompanying drawings, in which.

DETAILED DESCRIPTION OF THE INVENTION

The basic idea of the invention is to integrate a semiconductor waveguide (edge-emitting type) laser diode with a multiple-quantum-well (MQW) saturable absorber to form a new kind of optical modulator. The modulator can be used in a wide variety of systems, such as in ultra-fast and wideband signal transmission and processing technologies.

Figure 1:
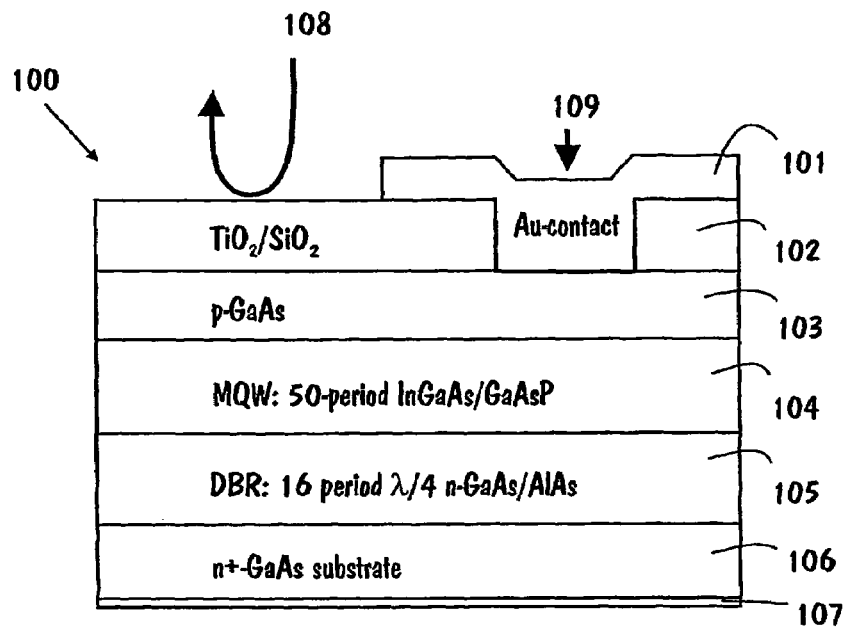
FIG. 1 illustrates a cross-section view of a prior art antiresonant Fabry-Pérot quantum well modulator.
Figure 2:
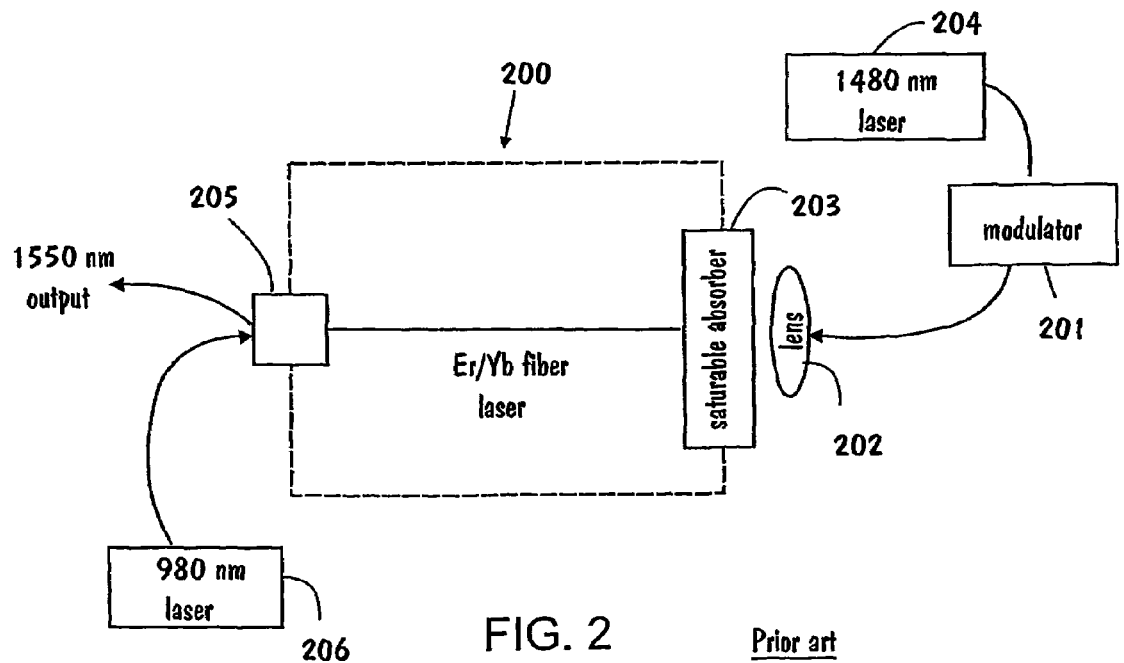
FIG. 2 shows a prior art mode-locked laser system using an optically pumped saturable Bragg mirror.
Figure 3:
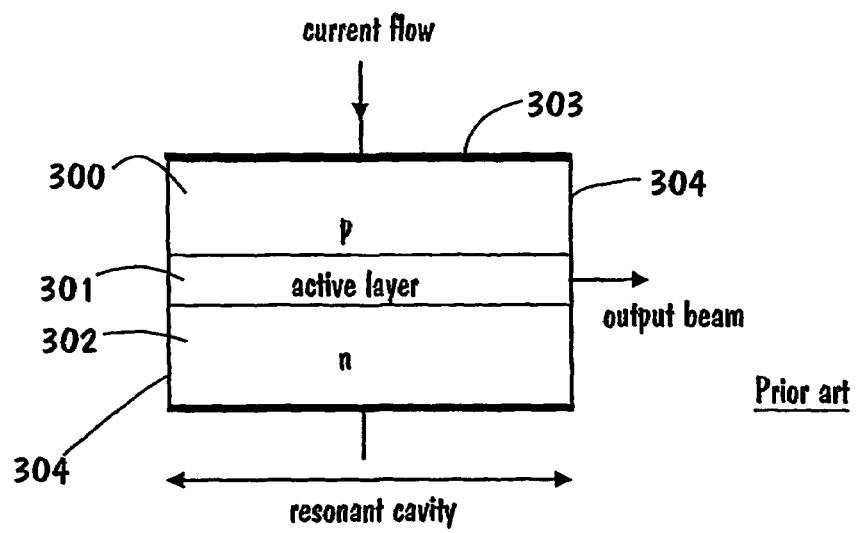
FIG. 3 illustrates a cross-sectional view of a semiconductor laser according to the prior art.

First we will briefly examine the structure and operation of a laser in general by referring to FIG. 3. Then the structure and operation of the invention is considered in detail with reference to the examples in FIGS. 4a, 4b, and 5.

FIG. 3 illustrates a cross-sectional view of a semiconductor laser. The laser comprises an active material 301, e.g. MQW, placed between a p-type semiconductor 300, which is doped with suitable impurity atoms and has an excess concentration of holes, and an n-type semiconductor 302 that has an excess concentration of electrons. The refractive index of this lapsing medium or active layer 301 must be greater than the refractive index of the p- or n-region confining the light within the said MQW region. When the semiconductor junction is forward biased, through the metallic contact 303, electrons and holes are injected into the active region thus emitting electro-magnetic energy at optical frequencies set by the band-gap of the active semiconductor. When the laser is sufficiently pumped, a population inversion occurs where there are more electrons in the excited state than the ground state. Spontaneous emission occurs when these electrons randomly return from the excited state to the ground state with the emission of a photon. Providing that the laser facets 304 have sufficient reflectivity for the said electromagnetic radiation, the stimulated emission of radiation, i.e. laser action, arises.

Figure 4A:
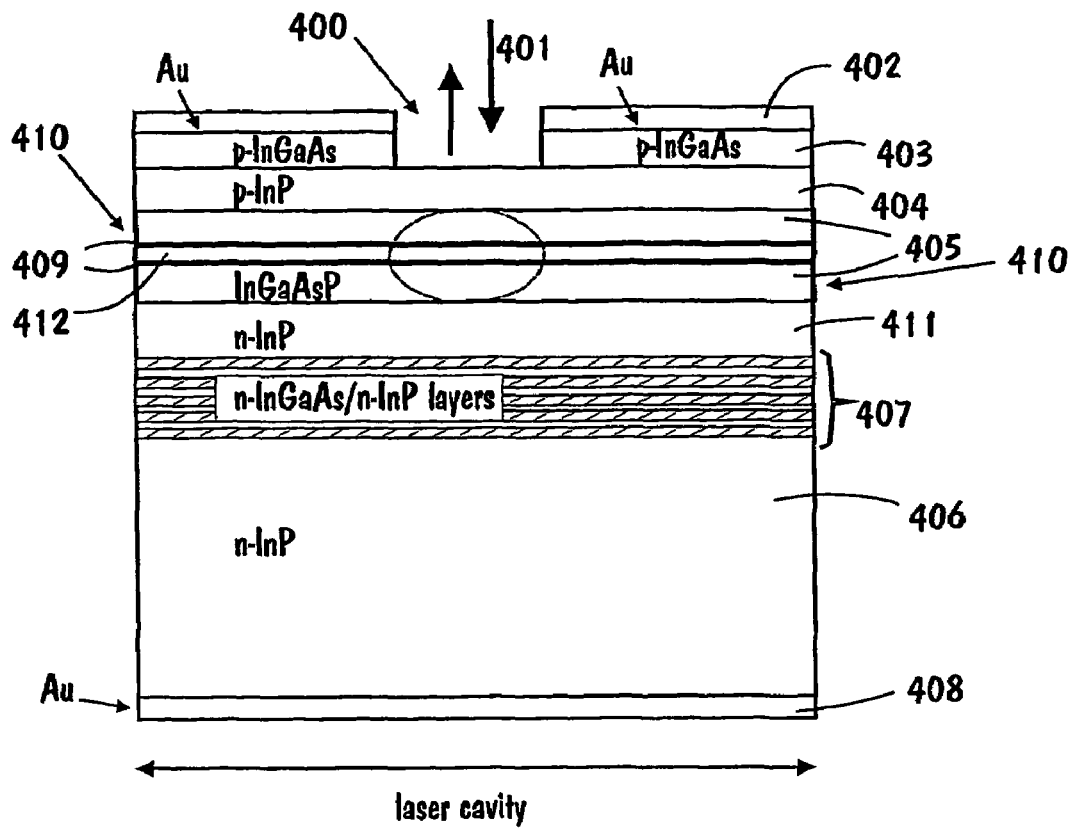
FIG. 4a illustrates a cross-section view of one example of the basic structure of an optically controlled surface modulator according to the invention.

FIG. 4a illustrates a cross-sectional view of the basic structure of an example of an optically controlled surface-normal modulator, according to the invention. It is to be noted that the relative dimensions of the structure shown in the figures may vary in reality. For example, the thickness of the layer 406 may be about 90% of the thickness of the complete structure.

An optically controlled surface-normal modulator is hereafter referred to in short as an "modulator".

The structure of the modulator comprises the following layers: metallic (e.g. Au) contacts 402 and 408, of which the former is on the top of the stack and the latter on the bottom; the layers between the contacts from top to bottom are a p-doped contact layer (e.g. indium gallium arsenide, InGaAs) 403, a p-doped cladding layer (e.g. indium phosphide, InP) 404, waveguide layers 405, quantum wells 409 within the waveguide layers, barriers 412 between the quantum wells, a n-doped cladding layer 411 (e.g. indium phosphide, InP), distributed Bragg reflectors DBR (e.g. n-GaInAs/n-InP) 407, and a substrate (e.g. InP) 406. Although in this example both layers 406 and 411 are InP, they can have a different structure (composition).

Figure 4B:
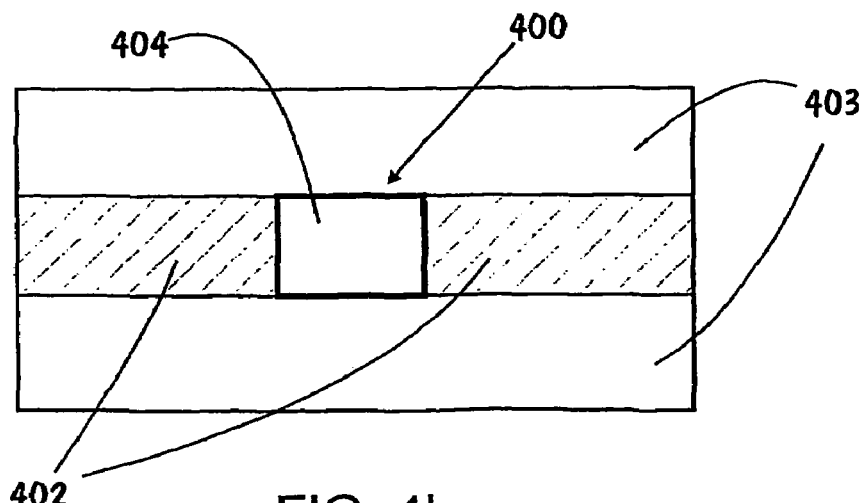
FIG. 4b shows the modulator of FIG. 4a as seen from above.

FIG. 4b illustrates the modulator as seen from above. The contact 402 is a straight narrow stripe-shaped sheet of gold (Au) located on top of the p-type semiconductor layer 403 and extending in longitudinal direction from one edge of the structure to another. In the middle of the gold contact layer 402 there is an opening or a window 400 for an optical light signal 401 to be applied to the modulator.

Thus the above-described multilayer structure comprises a built-in forward biased edge-emitting laser diode, i.e. in-plane junction laser, in which the optical axis of the laser diode is parallel with the layers of the modulator.

Hereafter the semiconductor laser diode is termed in short as a "laser".

The laser geometry is vertically defined by layers 404 and 406 and horizontally by reflective facets or mirrors at the ends of the laser cavity. The purpose of the mirrors is to provide strong optical feedback in the longitudinal direction, thereby converting the device into a laser oscillator with a total gain that compensates for optical losses in the laser cavity. The location of the mirrors is not restricted, i.e. the mirrors can also be located inside as well as outside the said laser structure. Preferably the mirrors have a high reflection coating to reduce the threshold current of the laser. The mirrors may also be the cleaved surfaces of the semiconductor crystal or polished, etc.

A modulator region is a nonlinear optical medium comprising a multiple-quantum-well structure, i.e. the region comprises a surface-normal reflector and a saturable absorber, where modulation of the optical light signal 401 occurs. In this example the saturable absorber is a stack of layers comprising GaInAsP quantum well layers. Strictly speaking the material of the saturable absorber comprises a semiconductor material which absorbs the signal wavelength and features appropriate saturation intensity.

The modulator region also includes a stack of semiconductor layers acting as a surface-normal Bragg reflector, i.e. periodic variations of the refractive index which are incorporated into the multilayer structure. As an example, in applications where wavelength 1.55 µm is required, the Bragg reflector may comprise 19.5 pairs of n-GaInAs/n-InP layers.

In practice, the wavelength of the incident signal determines the thickness and the material in the DBR layers, the number of periods, and the band-gap energy of the quantum well structure, i.e. the structure of the modulator is optimized in such a way that the modulation is as efficient as possible.

In a primary embodiment of the invention the modulator is a non-linear optical multilayered element controlled by intensity modulated optical signals generated by the above-described laser. Intensity modulated optical control signals are propagated parallel to the optical axis, when the laser is driven by an electrical control signal, i.e. when an above-threshold current is applied to the modulator.

The modulator has two optical paths. The first optical path carries the optical modulating signal or the optical control beam (signal). This path is formed by the in-plane laser cavity comprising optical waveguide 405 with end mirrors 410. The optical control signal propagates parallel with the plane of the active quantum wells region 409. The second optical path carries an optical signal 401 to be modulated. This optical signal is injected through the window 400. So it propagates perpendicular to the surface of the modulator, i.e. the first optical path and the second optical path cross each other perpendicularly at the region of the saturable absorber. The injected optical signal passes through the said region and is reflected back by the distributed Bragg reflector 407, after double-passes through the saturable absorber, to the output 400.

The quantum well structure should be constructed in such a way that parameters such as the bandgap energy and the number of MQWs are optimized for high modulation contrast of the saturable absorption.

The modulated in-plane laser light passes through the saturable absorber region (shown by a dotted circle in FIG. 4) and modulates its transmission by saturating the absorption. Therefore, the reflection of the modulator section is increased or decreased by increasing or decreasing the intensity of the optical control signal. The reflected optical signal therefore acquires the amplitude/intensity modulation corresponding to the reflectivity change.

Briefly, the modulating waveguide-type edge-emitting laser generates a modulating beam which strikes the surface-normal saturable absorber. Then the absorber is irradiated with the optical input signal. Absorber saturation is adjusted to ensure that in an ON-state, the transmission of the saturable absorber is high, i.e. the saturable absorber is transparent for the light. Correspondingly in an OFF-state, the transmission is low, i.e. the light is strongly attenuated.

The structure of the modulator ensures the optimum overlap of the modulating control beam and the signal beam to be modulated. Thus when the two beams overlap in the saturation absorber region, modulation efficiency is high.

The recovery time of the saturable absorber region can be changed using an ion implantation. For example, to reduce the recovery time of the saturable absorber to 2-4 ps, the samples can be irradiated by 10 MeV $Ni^+$ ions with an irradiation dose of $2 \times 10^{11}$ $cm^{-2}$. However, as a matter of fact, in the above-described modulator the modulation speed is limited by the speed of the control laser and not by the saturable absorber.

Figure 5:
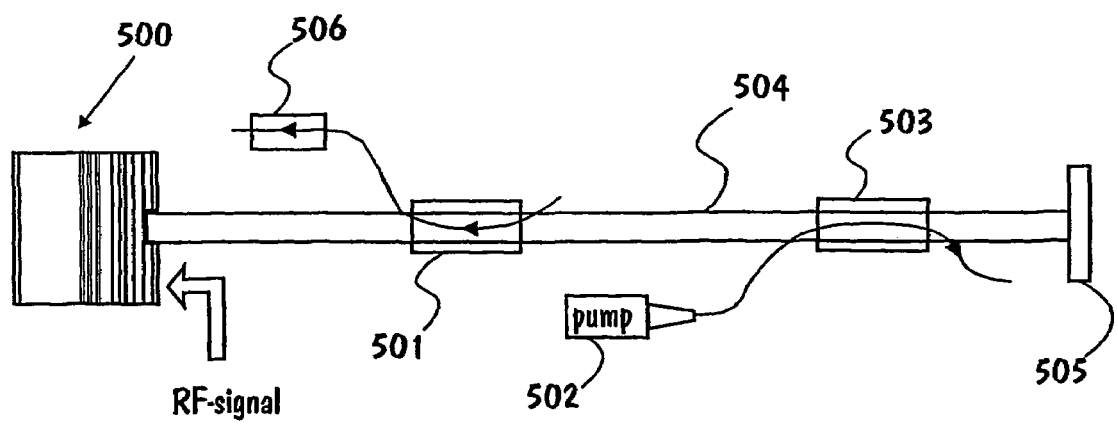
FIG. 5 illustrates a mode-locked laser system employing the inventive modulator.

FIG. 5 illustrates a modulator device in use, according to the invention. This example of modulator implementation deals with stabilization of the operation of a pulsed fiber laser, e.g. intra-cavity modulation. It is assumed that the modulator device 500 is of the kind described above in connection with FIGS. 4a and 4b. Besides the modulator, the system in FIG. 5 comprises a gain medium, e.g. a rare-earth doped fiber, such as an erbium-doped optical fiber 504, an optical coupler 503 used to couple a light beam from an optical pump source 502 to the gain medium, another optical coupler 501 to extract the laser radiation, an optical isolator 506 to eliminate the spurious reflections from the output port, and a mirror 505. The mirror and the modulator are butt-coupled to the fiber cavity, but other coupling schemes can be employed, e.g. using focusing optics. The light beam emitted by the pump source 502 is used for pumping the active material, resulting in stimulated emission of light.

The active semiconductor material of the modulator has a band-gap suitably designed to provide sufficient absorption at a wavelength close to the signal beam wavelength. Thus if no electrical signal is applied to the modulator or if the control signal is sufficiently small, the modulator corresponds to the high-loss state. Without modulation applied, the device can be used for starting-up a passive mode-locking operation of the laser. Providing that the pump power is sufficient, the system generates a passive harmonic mode-locked pulse train traveling back-and-forth in the laser cavity. Since the mode-locking mechanism is passive, the pulse train suffers from repetition rate instabilities and pulse drop-out.

When the modulator is driven by an RF-signal with an amplitude sufficient to generate laser light within the edge-emitting laser section of the modulator, losses introduced by the saturable absorber section are controlled, i.e. the saturable absorber is bleached when the semiconductor built-in laser emits radiation.

There are various ways to construct the modulator. For example, the modulator region can be optically connected with the laser cavity, or it may occupy a fraction of the laser cavity, or it may be located within the above-mentioned first optical path. The layers of the structure may be different from the above examples, i.e. dimensions and materials may vary as well as the number of layers. The order of the layers in the structure may also vary. The guiding of the laser signal can also be performed in various ways. Some examples are index guiding, gain guiding, or using a tapered design. The gain medium of the semiconductors can be any suitable material. Without employing the Bragg reflector, the modulator can also be used in transmission, providing a corresponding window is open within the bottom n-contact.

Although the invention was described above with reference to the examples shown in the appended drawings, it will be evident to any person skilled in the art that the invention can be changed within the scope of the inventive idea presented above and in the appended claims.

The invention can be used in a variety of different applications, for example, in mode-locked lasers for repetition rate stabilization, in optical signal processing, and in interlocking systems.

The invention claim is:

1. An optical modulator having a structure composed of a multilayer stack, comprising:
    a first metallic contact layer on the top of the stack and a second metallic contact layer on the bottom of the stack, said contact layer serving as electrodes for an external electrical control signal,
    a plurality of semiconductor layers between said contact layers,
    an input opening in the first metallic contact layer, enabling injection of an external optical signal into the stack and propagation of said external optical sianal perpendicularly through the semiconductor layers, wherein a first optical path is formed,
    an internal semiconductor waveguide laser formed from adjacent layers inside the stack, the internal waveguide laser generating a modulating laser beam parallel with said adjacent semiconductor layers in response to the external electrical control signal, wherein the waveguide forms a second optical path perpendicular to the first optical path, and
    an absorber section integrated to the internal semiconductor waveguide laser in a region, where the first optical signal path intersects the second optical signal path, saturation intensity of the absorber being altered by the modulating laser beam from the internal semiconductor waveguide laser in response to the external electrical control signal, wherein the external optical signal passing through the absorber is modulated by alternating the saturation intensity of the absorber.

2. The optical modulator as in claim 1, wherein the absorber section comprises at least one layer including an active semiconductor region forming waveguides for the laser beam.

3. The optical modulator as in claim 2, wherein the absorber section is a stack of layers comprising multiple-quantum-well layers with transmission characteristics controlled by altering the intensity or amplitude of the modulating laser beam.

4. The optical modulator as in claim 1, comprising reflective mirrors at both ends of the layers forming the internal semiconductor waveguide laser.

5. The optical modulator as in claim 1, further comprising at least one reflecting layer for reflecting back the modulated optical signal passed through the absorber section.

6. The optical modulator as in claim 5, comprising an output opening in the first metallic contact layer for enabling the modulated optical signal to exit from the optical modulator.

7. The optical modulator as in claim 6, wherein an opening in the outermost layer of the multilayer structure forms both the input and the output.

8. The optical modulator as in claim 1, wherein the absorber section is a saturable absorber section.

9. The optical modulator as in claim 1, comprising an output opening in the second metallic contact layer for enabling the modulated optical signal to exit from the optical modulator, wherein the first optical path extends through the multilayer stack.

* * * * *

UNITED STATES PATENT AND TRADEMARK OFFICE
CERTIFICATE OF CORRECTION

PATENT NO.      : 7,313,291 B2                                             Page 1 of 1
APPLICATION NO. : 10/974533
DATED           : December 25, 2007
INVENTOR(S)     : Okhotnikov et al.

It is certified that error appears in the above-identified patent and that said Letters Patent is hereby corrected as shown below:

Column 6, line 54, claim 1, line 11 "sianal" should be --signal--.

Signed and Sealed this

Third Day of June, 2008

JON W. DUDAS
*Director of the United States Patent and Trademark Office*